United States Patent
Kim

(10) Patent No.: US 8,860,015 B2
(45) Date of Patent: Oct. 14, 2014

(54) ORGANIC LIGHT EMITTING DISPLAY APPARATUS AND METHOD OF MANUFACTURING THE SAME

(71) Applicant: Samsung Display Co., Ltd., Yongin (KR)

(72) Inventor: Mu-Gyeom Kim, Yongin (KR)

(73) Assignee: Samsung Display Co., Ltd., Giheung-Gu, Yongin, Gyeonggi-Do (KR)

(*) Notice: Subject to any disclaimer, the term of this patent is extended or adjusted under 35 U.S.C. 154(b) by 193 days.

(21) Appl. No.: 13/632,789

(22) Filed: Oct. 1, 2012

(65) Prior Publication Data

US 2013/0234117 A1    Sep. 12, 2013

(30) Foreign Application Priority Data

Mar. 6, 2012 (KR) .................. 10-2012-0022887

(51) Int. Cl.
*H01L 35/24* (2006.01)

(52) U.S. Cl.
USPC .................................... 257/40; 257/E51.001

(58) Field of Classification Search
USPC ............................................ 257/40, E51.001
See application file for complete search history.

(56) References Cited

U.S. PATENT DOCUMENTS

2006/0091785 A1   5/2006   Lee et al.
2007/0131926 A1   6/2007   Lee et al.

FOREIGN PATENT DOCUMENTS

KR   10-2005-0105852   11/2005
KR   10-0669733        1/2007
KR   10-2007-0096086   10/2007
KR   10-2008-0057877   6/2008

*Primary Examiner* — Anthony Ho
(74) *Attorney, Agent, or Firm* — Robert E. Bushnell, Esq.

(57) ABSTRACT

The organic light emitting display apparatus includes a substrate; a gate electrode formed on the substrate; a source electrode and a drain electrode formed on the gate electrode to be insulated from the gate electrode; an active layer formed on the source electrode and the drain electrode and containing an organic semiconductor material, at least one region of the active layer overlapping with the gate electrode; a pixel defining layer formed on the active layer and including an aperture; an intermediate layer disposed to correspond to the aperture and including an organic emission layer; and an opposite electrode formed on the intermediate layer. One of the source electrode and the drain electrode is formed to be long to act as a pixel electrode and includes a first conductive layer and a second conductive layer on the first conductive layer, the second conductive layer formed to contact the intermediate layer.

19 Claims, 3 Drawing Sheets

ORGANIC LIGHT EMITTING DISPLAY APPARATUS AND METHOD OF MANUFACTURING THE SAME

CLAIM OF PRIORITY

This application makes reference to, incorporates the same herein, and claims all benefits accruing under 35 U.S.C. §119 from an application earlier filed in the Korean Intellectual Property Office on 6 Mar. 2012 and there duly assigned Serial No. 10-2012-0022887.

BACKGROUND OF THE INVENTION

1. Field of the Invention

One or more aspects of the present invention relate to an organic light emitting display apparatus and a method of manufacturing the same, and more particularly, to an organic light emitting display apparatus having improved electrical and flexible characteristics.

2. Description of the Related Art

Recently, display apparatuses have been replaced with portable thin film flat panel display apparatuses. Among flat panel display apparatuses, an organic light emitting display apparatus is a self-emitting display apparatus and has a larger viewing angle, better contrast characteristics, and a faster response speed. Therefore, the organic light emitting display apparatus has drawn attention as the next-generation display apparatus.

An organic light-emitting display apparatus generally includes an intermediate layer, a pixel electrode, and an opposite electrode. The intermediate layer includes an organic emission layer. When voltage is applied to the pixel electrode and the opposite electrode, visible light is emitted from the organic emission layer.

Meanwhile, much attention has been paid to flexible organic light emitting display apparatuses that are easy to be bent or folded for a user's convenience.

Since it is difficult to select a material that is not only flexible but also has electrical characteristics and to manufacture an organic light emitting display apparatus by using such a material, restrictions are applied to the manufacture of an organic light emitting display apparatus having desired flexible and electrical characteristics.

SUMMARY OF THE INVENTION

One or more aspects of the present invention provide an organic light emitting display apparatus having improved electrical and flexible characteristics and a method of manufacturing the same.

In accordance with an aspect of the present invention, an organic light emitting display apparatus may include a substrate; a gate electrode formed on the substrate; a source electrode and a drain electrode formed on the gate electrode to be insulated from the gate electrode; an active layer formed on the source electrode and the drain electrode and containing an organic semiconductor material, at least one region of the active layer overlapping with the gate electrode; a pixel defining layer formed on the active layer and including an aperture; an intermediate layer disposed to correspond to the aperture of the pixel defining layer and including an organic emission layer; and an opposite electrode formed on the intermediate layer. One of the source electrode and the drain electrode is formed to be long to act as a pixel electrode. One of the source and drain electrodes includes a first conductive layer and a second conductive layer on the first conductive layer, the second conductive layer is formed to contact the intermediate layer.

The pixel defining layer may include a material, the HOMO energy level of which is lower than a work function of the second conductive layer.

The pixel defining layer may include an electron injection material or an electron transport material.

The pixel defining layer may include LiF, NaCl, CsF, $Li_2O$, BaO, LiQ, or $AlQ_3$.

Each of the source electrode and the drain electrode may include the first conductive layer and the second conductive layer on the first conductive layer.

The first conductive layer may include molybdenum (Mo), aluminum (Al), titanium (Ti), or tungsten (W).

The second conductive layer may include an indium tin oxide (ITO), an indium zinc oxide (IZO), a zinc oxide (ZnO), an indium oxide ($In_2O_3$), an indium gallium oxide (IGO), or an aluminum doped zinc oxide (AZO).

The organic semiconductor material may include [1]Benzothieno[3,2-b]benzothiophene (BTBT), dinaphtho[2,3-b:2', 3'-f]thieno[3,2-b]thiophene (DNTT), pentacene, or TIPS (Triisopropylsilylethynyl)-pentacene.

The organic light emitting display apparatus may further include a gate insulating layer formed between the gate electrode and the source electrode and between the gate electrode and the drain electrode. The active layer may be disposed to contact the gate insulating layer.

The second conductive layer may be disposed apart from the gate insulating layer.

The gate electrode may include molybdenum (Mo), aluminum (Al), titanium (Ti), or tungsten (W).

The active layer may be disposed in a space between the source electrode and the drain electrode and contact upper surfaces of the source electrode and the drain electrode. A width from among widths of the active layer, which corresponds to a direction perpendicular to a direction of the source electrode facing the drain electrode, may be equal to or greater than widths of the source electrode and the drain electrode.

An electrode acting as a pixel electrode from among the source electrode and the drain electrode, may act as an anode.

In accordance with another aspect of the present invention, a method of manufacturing an organic light emitting display apparatus may include steps of forming a gate electrode on a substrate; forming a source electrode and a drain electrode on the gate electrode to be insulated from the gate electrode; forming an active layer on the source electrode and the drain electrode to have at least one region that overlaps with the gate electrode, the active layer containing an organic semiconductor material; forming a pixel defining layer on the active layer to have an aperture; forming an intermediate layer to correspond to the aperture of the pixel defining layer, the intermediate layer including an organic emission layer; and forming an opposite electrode on the intermediate layer. One of the source electrode and the drain electrode may be formed to be long to act as a pixel electrode, and may include a first conductive layer and a second conductive layer on the first conductive layer. The second conductive layer may be formed to contact the intermediate layer.

The active layer may be formed according to a deposition process, a printing process, or a transfer process.

The pixel defining layer may be formed according to a deposition process, a printing process, or a transfer process.

The intermediate layer may be formed according to a deposition process, a printing process, or a transfer process.

The opposite electrode may be formed according to a deposition process, a printing process, or a transfer process.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Hereinafter, exemplary embodiments of the present invention will be described with reference to the accompanying drawings.

Figure 1:
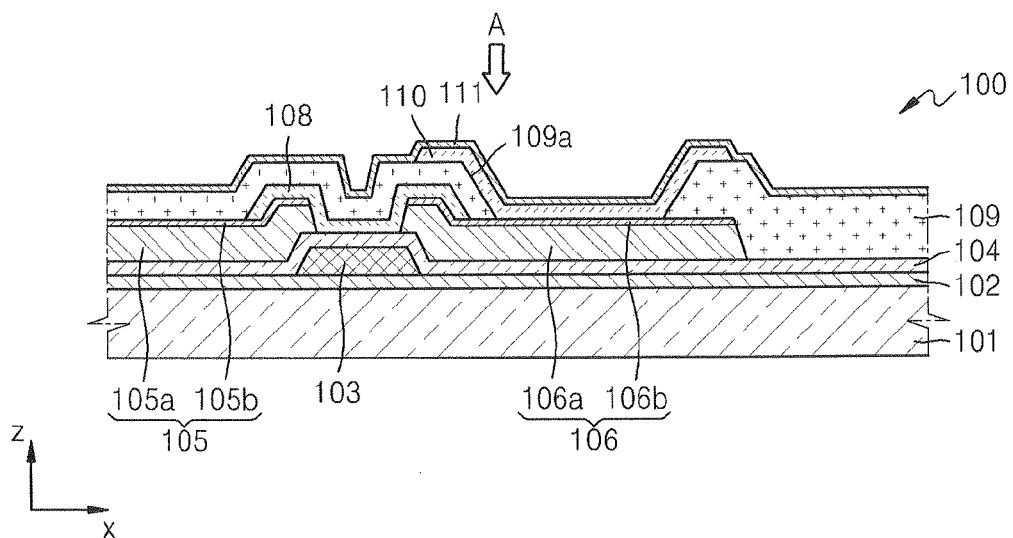
FIG. 1 is a schematic cross-sectional view of an organic light emitting display apparatus constructed with an embodiment of the present invention.
Figure 2:
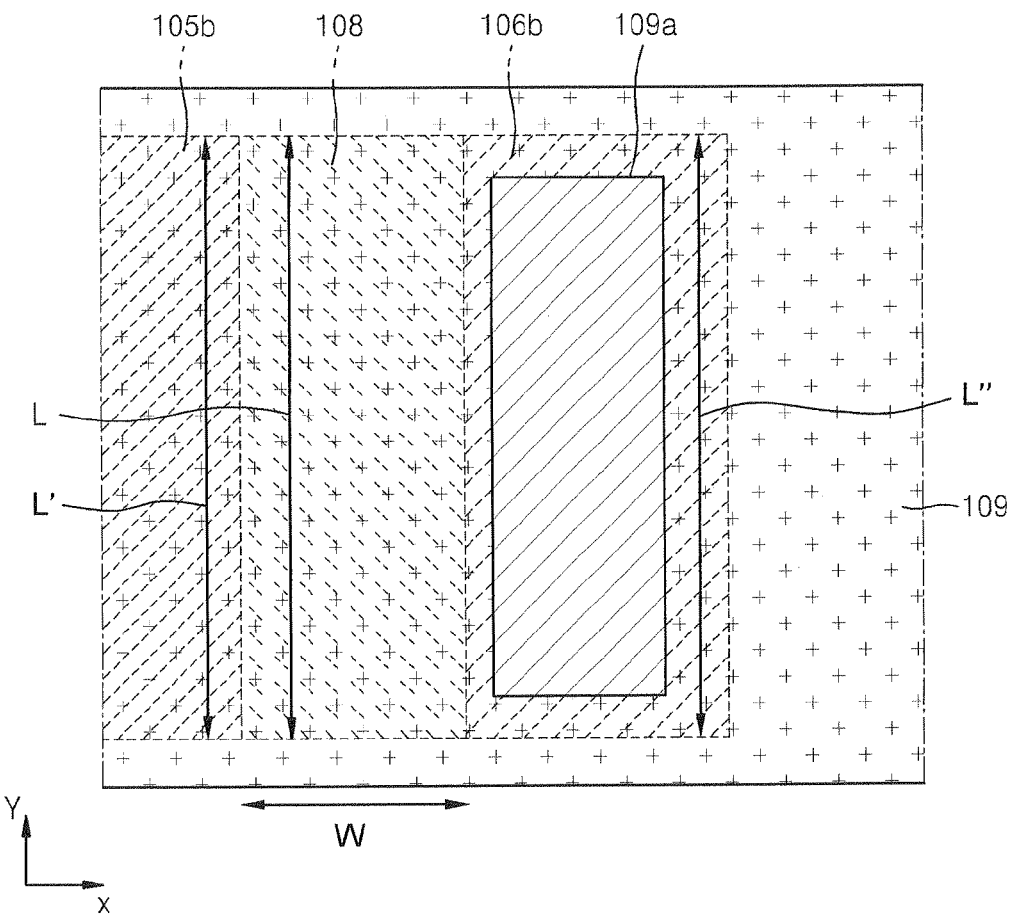
FIG. 2 is a plan view taken, viewed from a direction indicated by an arrow A of FIG. 1.

FIG. 1 is a schematic cross-sectional view of an organic light emitting display apparatus 100 constructed with an embodiment of the present invention. FIG. 2 is a plan view taken, viewed from a direction indicated by an arrow A of FIG. 1.

Referring to FIG. 1, the organic light emitting display apparatus 100 includes a substrate 101, a gate electrode 103, a source electrode 105, a drain electrode 106, an active layer 108, a pixel defining layer 109, an intermediate layer 110, and an opposite electrode 111.

Specifically, the substrate 101 may be formed of a $SiO_2$-based glass material. The present invention is however not limited thereto and the substrate 101 may be formed of a transparent plastic material to improve the flexibility of the substrate 101. In this case, the transparent plastic material may be at least one material selected among a group consisting of various organic materials.

A buffer layer 102 is formed on the substrate 101. The buffer layer 102 may contain an inorganic material, such as a silicon oxide, a silicon nitride, a silicon oxynitride, an aluminum oxide, an aluminum nitride, a titanium oxide, or a titanium nitride; an organic material, such as polyimide, polyester, or acryl; or a stacked structure of materials selected from among these materials. The buffer layer 102 is not an indispensable component, and may not be used to manufacture the organic light emitting display apparatus 100 if needed.

The buffer layer 102 provides a flat surface on the substrate 101 and prevents moisture or foreign substances from penetrating into the substrate 101.

The gate electrode 103 is formed on the buffer layer 102. The gate electrode 103 contains molybdenum (Mo), aluminum (Al), titanium (Ti), or tungsten (W). Specifically, the gate electrode 103 may have a stacked structure of molybdenum (Mo), aluminum (Al), and molybdenum (Mo). As another example, the gate electrode 103 may have a stacked structure of titanium (Ti), aluminum (Al), and titanium (Ti).

A gate insulating layer 104 is formed on the gate electrode 103. The gate insulating layer 104 may be formed of any of various insulating materials.

The source electrode 105 and the drain electrode 106 are formed on the gate insulating layer 104. One of the source electrode 105 and the drain electrode 106 may be formed to be long to act as a pixel electrode. In the current embodiment, the drain electrode 106 acts as the pixel electrode but the present invention is not limited thereto. In one embodiment, one of the source electrode 105 and the drain electrode 106 may be disposed opposite to and face the opposite electrode 111, the intermediate layer 110 may be disposed between the opposite electrode 111 and the one of the source electrode 105 and the drain electrode 106, and the intermediate layer 110 may be in direct contact with the opposite electrode 111 and the one of the source electrode 105 and the drain electrode 106.

The source electrode 105 includes a first conductive layer 105a and a second conductive layer 105b. The first conductive layer 105a contains molybdenum (Mo), aluminum (Al), titanium (Ti), or tungsten (W). Specifically, the first conductive layer 105a may have a stacked structure of molybdenum (Mo), aluminum (Al), and molybdenum (Mo). As another example, the first conductive layer 105a may have a stacked structure of titanium (Ti), aluminum (Al), and titanium (Ti). The second conductive layer 105b may contain an indium tin oxide (ITO), an indium zinc oxide (IZO), a zinc oxide (ZnO), an indium oxide ($In_2O_3$), an indium gallium oxide (IGO), or an aluminum doped zinc oxide (AZO).

The drain electrode 106 includes a first conductive layer 106a and a second conductive layer 106b. The first conductive layer 106a contains molybdenum (Mo), aluminum (Al), titanium (Ti), or tungsten (W). Specifically, the first conductive layer 106a may have a stacked structure of molybdenum (Mo), aluminum (Al), and molybdenum (Mo). As another example, the first conductive layer 106a may have a stacked structure of titanium (Ti), aluminum (Al), and titanium (Ti). The second conductive layer 106b may contain an indium tin oxide (ITO), an indium zinc oxide (IZO), a zinc oxide (ZnO), an indium oxide ($In_2O_3$), an indium gallium oxide (IGO), or an aluminum doped zinc oxide (AZO).

The active layer 108 is formed on the source electrode 105 and the drain electrode 106. The active layer 108 is formed to overlap with at least the gate electrode 103. In particular, the active layer 108 is disposed in a space between the source electrode 105 and the drain electrode 106 to contact the gate insulating layer 104. The active layer 108 contains an organic semiconductor material. In detail, the active layer 108 contains [1]Benzothieno[3,2-b]benzothiophene (BTBT), dinaphtho[2,3-b:2',3'-f]thieno[3,2-b]thiophene (DNTT), pentacene, or TIPS (Triisopropylsilylethynyl)-pentacene.

The active layer 108 is formed not to overlap with a certain upper region of the second conductive layer 106b of the drain electrode 106, with the certain upper region in contact with the intermediate layer 110. In other words, the active layer 108 is formed to be disposed apart from a region of the second conductive layer 106b of the drain electrode 106, which contacts the intermediate layer 110.

In this case, a width L of the active layer 108 in a direction perpendicular to a direction W along which the source electrode 105 faces the drain electrode 106, is maximized. That is, at least the width L of the active layer 108 is set to be equal to or greater than those of the source electrode 105 and the drain electrode 106.

The pixel defining layer 109 is formed on the active layer 108. The pixel defining layer 109 includes an aperture 109a. The aperture 109a is formed to correspond to the predetermined upper region of the drain electrode 106, with the predetermined upper region of the drain electrode 106 not overlapping with the active layer 108. In other words, a region of the second conductive layer 106b of the drain electrode 106, which does not overlap with the active layer 108, corresponds to the aperture 109a.

The pixel defining layer 109 may contain any of various materials. For example, the pixel defining layer 109 may contain a material, the HOMO energy level of which is lower than a work function of the second conductive layer 106b of the drain electrode 106. Specifically, the pixel defining layer 109 may contain an electron injection material or an electron transport material. For example, the pixel defining layer 109 may contain LiF, NaCl, CsF, $Li_2O$, BaO, Liq, or $Alq_3$.

The intermediate layer 110 is formed on the pixel defining layer 109. The intermediate layer 110 includes an organic emission layer (not shown). The intermediate layer 110 is formed to correspond to the aperture 109a of the pixel defining layer 109. Thus, the intermediate layer 110 contacts the second conductive layer 106b of the drain electrode 106.

The intermediate layer 110 may be formed of a low-molecular weight organic material or a high-molecular weight organic material. If the low-molecular weight organic material is used, the intermediate layer 110 may have a single or multi-layer structure including at least one selected from the group consisting of a hole injection layer (HIL), a hole transport layer (HTL), an organic emission layer, an electron transport layer (ETL), and an electron injection layer (EIL).

The HIL may be formed of a phthalocyanine compound, e.g., copper phthalocyanine (CuPc), or a starburst type amine-based compound, e.g., TCTA, m-MTDATA, or m-MTDAPB.

The HTL may be formed of N,N'-bis 3-methylphenyl)-N, N'-diphenyl-[1,1-biphenyl]-4,4'-diamine (TPD), N,N'-di (naphthalene-1-yl)-N,N'-diphenyl benzidine (α-NPD), or the like.

The EIL may be formed of LiF, NaCl, CsF, Li2O, BaO, or Liq.

The ETL may be formed of $Alq_3$.

The organic emission layer may contain a host material and a dopant material.

Examples of the host material may include tris(8-hydroxyquinolinato)aluminum (Alq3), 9,10-di(naphth-2-yl)anthracene (AND), 3-tert-butyl-9,10-di(naphth-2-yl)anthracene (TBADN), 4,4'-bis(2,2-diphenyl-ethene-1-yl)-4,4'-dimethylphenyl (DPVBi), 4,4'-bis(2,2-diphenyl-ethene-1-yl)-4,4'-dimethylphenyl (p-DMDPVBi), tert(9,9-diarylfluorene)s (TDAF), 2-(9,9'-spirobifluorene-2-yl)-9,9'-spirobifluorene (BSDF), 2,7-bis(9,9'-spirobifluorene-2-yl)-9,9'-spirobifluorene (TSDF), bis(9,9-diarylfluorene)s (BDAF), 4,4'-bis(2,2-diphenyl-ethene-1-yl)-4,4'-di-(tert-butyl)phenyl (p-TDPVBi), 1,3-bis(carbazol-9-yl)benzene (mCP), 1,3,5-tris(carbazol-9-yl)benzene (tCP), 4,4',4"-tris(carbazol-9-yl)triphenylamine (TcTa), 4,4'-bis(carbazol-9-yl)biphenyl (CBP), 4,4'-bis(9-carbazolyl)-2,2'-dimethyl-biphenyl (CBDP), 4,4'-bis(carbazol-9-yl)-9,9-dimethyl-fluorene (DMFL-CBP), 4,4'-bis(carbazol-9-yl)-9,9-bis(9-phenyl-9H-carbazol)fluorene (FL-4CBP), 4,4'-bis(carbazol-9-yl)-9,9-di-tolyl-fluorene (DPFL-CBP), 9,9-bis(9-phenyl-9H-carbazol)fluorene (FL-2CBP), and the like.

Examples of the dopant material may include 4,4'-bis[4-(di-p-tolylamino)styryl]biphenyl (DPAVBi), 9,10-di(naph-2-tyl)anthracene (ADN), 3-tert-butyl-9,10-di(naph-2-tyl)panthracene (TBADN), and the like.

The drain electrode 106 acting as the pixel electrode may function as an anode, and the opposite electrode 111 may function as a cathode.

The opposite electrode 111 may be formed of silver (Ag), magnesium (Mg), aluminum (Al), platinum (Pt), palladium (Pd), gold (Au), nickel (Ni), neodymium (Nd), iridium (Ir), chrome (Cr), lithium (Li), or calcium (Ca). Also, the opposite electrode 111 may contain ITO, IZO, ZnO, or $In_2O_3$.

Although not shown, a sealing member may be formed on the opposite electrode 111. The sealing member may have a structure in which a layer consisting of an inorganic material, e.g., a silicon oxide or a silicon nitride, and a layer consisting of an organic material, e.g., epoxy or polyimide, may be alternately formed.

In the current embodiment, the flexibility of the organic light emitting display apparatus 100 may be easily improved by forming the active layer 108 to contain an organic semiconductor material. Accordingly, the organic light emitting display apparatus 100 may be embodied as a foldable or rollable organic light emitting display apparatus.

Also, since one of the source electrode 105 and the drain electrode 106 is formed to be long to act as a pixel electrode, the total thickness of the organic light emitting display apparatus 100 may be reduced and a process of manufacturing the organic light emitting display apparatus 100 may be remarkably simplified.

In particular, in accordance with the current embodiment, the drain electrode 106 acts as a pixel electrode and includes the first conductive layer 106a and the second conductive layer 106b. Alternatively, the source electrode 105 may act as a pixel electrode. The first conductive layer 106a and the second conductive layer 106b may be individually formed to improve both the electrical characteristics of a thin film transistor (TFT) and the luminescent efficiency of the intermediate layer 110.

That is, the first conductive layer 106a is formed of a material having high electrical conductivity, e.g., molybdenum (Mo), aluminum (Al), titanium (Ti), or tungsten (W), so as to allow current to smoothly flow between the source electrode 105 and the drain electrode 106 via the active layer 108. The second conductive layer 106b is formed of a material having a low work function, e.g., an indium tin oxide (ITO), an indium zinc oxide (IZO), a zinc oxide (ZnO), an indium oxide ($In_2O_3$), an indium gallium oxide (IGO), or an aluminum doped zinc oxide (AZO), so that holes may be easily injected from the drain electrode 106 to the intermediate layer 110.

In the current embodiment, the pixel defining layer 109 contains an electron injection material or an electron transport material. In detail, the pixel defining layer 109 has a lower HOMO energy level than the work function of the second conductive layer 106b of the drain electrode 106. Thus, when holes are injected from the drain electrode 106 acting as a pixel electrode to the intermediate layer 110, the holes may be prevented from leaking to the pixel defining layer 109. Also, holes may be prevented from leaking to the pixel defining layer 109 from the active layer 108. Thus, it is possible to significantly increase a probability that a large amount of holes will be present in the intermediate layer 110 by improving a capability of injecting holes from the drain electrode 106 to the intermediate layer 110, thereby improving the efficiency of recombination of holes and electrons in the intermediate layer 110. Accordingly, the electrical and luminescent characteristics of the organic light emitting display apparatus 100 may be improved.

The width L of the active layer 108 in the direction perpendicular to the direction W along which the source electrode 105 faces the drain electrode 106, is maximized. That is, at least the width L of the active layer 108 is set to be equal to or greater than those of the source electrode 105 and the drain electrode 106 (L' and L"). In other words, a channel width of the TFT is increased to maximize the mobility of electrons between the source electrode 105 and the drain electrode 106 via the active layer 108. Accordingly, the electrical characteristics of the organic light emitting display apparatus 100 may be easily improved.

FIGS. 3A through 3F are cross-sectional views sequentially illustrating a method of manufacturing the organic light emitting display apparatus 100 of FIG. 1, according to an embodiment of the present invention.

Figure 3A:
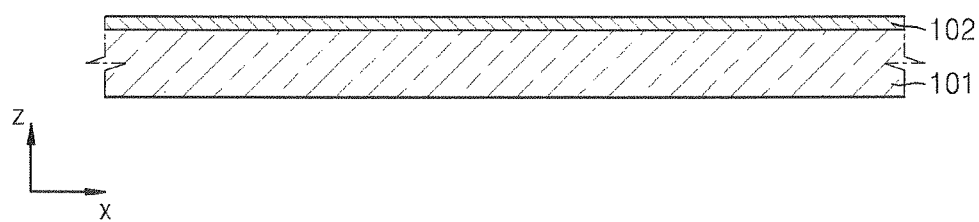
FIGS. 3A to 3F are cross-sectional views sequentially illustrating a method of manufacturing the organic light emitting display apparatus of FIG. 1, according to an embodiment of the present invention.

Specifically, in reference to FIG. 3A, a buffer layer 102 is formed on a substrate 101. The buffer layer 102 is not an indispensable component and may thus not be used to manufacture the organic light emitting display apparatus 100 if needed.

Figure 3B:
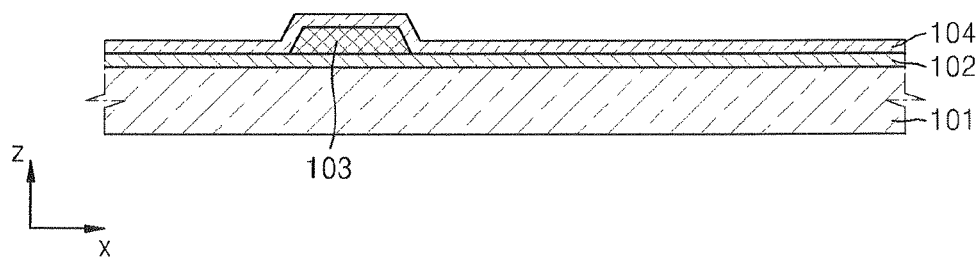

Then, referring to FIG. 3B, a gate electrode 103 is formed on the buffer layer 102. Then, a gate insulating layer 104 is formed on the gate electrode 103 by using an insulating material.

Figure 3C:
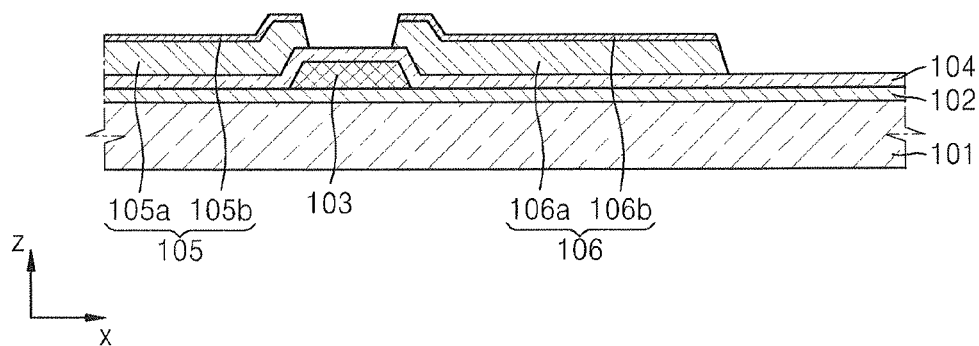

Then, referring to FIG. 3C, a source electrode 105 and a drain electrode 106 are formed on the gate insulating layer 104. The drain electrode 106 from among the source electrode 105 and the drain electrode 106 may be formed to be long to act as a pixel electrode.

The source electrode 105 may include a first conductive layer 105a and a second conductive layer 105b. The drain electrode 106 may include a first conductive layer 106a and a second conductive layer 106b. The source electrode 105 and the drain electrode 106 may be formed according to any of various methods. For example, the source electrode 105 and the drain electrode 106 may be formed by forming a layer containing molybdenum (Mo), aluminum (Al), titanium (Ti), or tungsten (W), forming a layer containing an indium tin oxide (ITO), an indium zinc oxide (IZO), a zinc oxide (ZnO), an indium oxide ($In_2O_3$), an indium gallium oxide (IGO), or an aluminum doped zinc oxide (AZO), and then patterning the resultant structure once so that the source electrode 105 and the drain electrode 106 may not overlap with a predetermined region of the gate electrode 103.

Figure 3D:
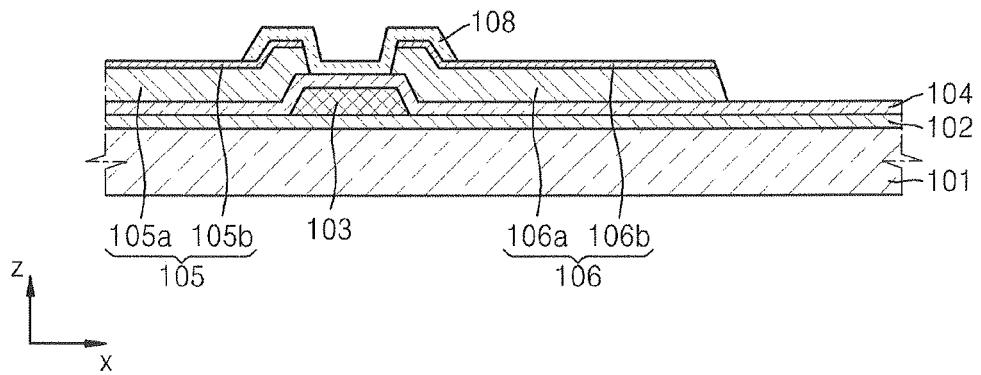

Then, in reference to FIG. 3D, an active layer 108 is formed on the source electrode 105 and the drain electrode 106. The active layer 108 may overlap with at least the gate electrode 103. In particular, the active layer 108 may be disposed in a space between the source electrode 105 and the drain electrode 106, and may contact the gate insulating layer 104. The active layer 108 contains an organic semiconductor material.

The active layer 108 is formed not to overlap with a predetermined upper region of the second conductive layer 106b of the drain electrode 106. When a pattern of the active layer 108 is formed, a wet process, e.g., a photolithographic process, may not be used but a deposition process, a printing process, or a transfer process may be used. Thus, the organic semiconductor material contained in the active layer 108 may be effectively prevented from being damaged.

Figure 3E:
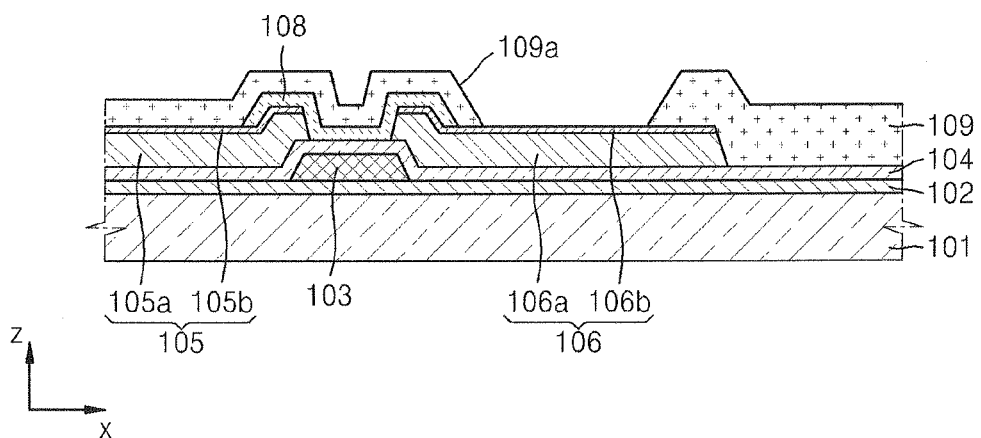

Then, in reference to FIG. 3E, a pixel defining layer 109 is formed on the active layer 108. The pixel defining layer 109 includes an aperture 109a. The aperture 109a may correspond to a predetermined upper region of the drain electrode 106. In other words, a predetermined region of the second conductive layer 106b of the drain electrode 106, which does not overlap with the active layer 108, corresponds to the aperture 109a.

The pixel defining layer 109 may contain various materials. In particular, the pixel defining layer 109 may contain a material, the HOMO energy level of which is lower than the work function of the second conductive layer 106b of the drain electrode 106. In detail, the pixel defining layer 109 may contain an electron injection material of an electron transport material. For example, the pixel defining layer 109 may contain LiF, NaCl, CsF, Li2O, BaO, Liq, or $AlQ_3$.

The deposition process, the printing process, or the transfer process may be used to form the pixel defining layer 109. When a pattern of the pixel defining layer 109 is formed, a wet process, e.g., the photolithographic process, may not be used but the deposition process, the printing process, or the transfer process may be used. Thus, the organic semiconductor material contained in the active layer 108 may be effectively prevented from being damaged.

Figure 3F:
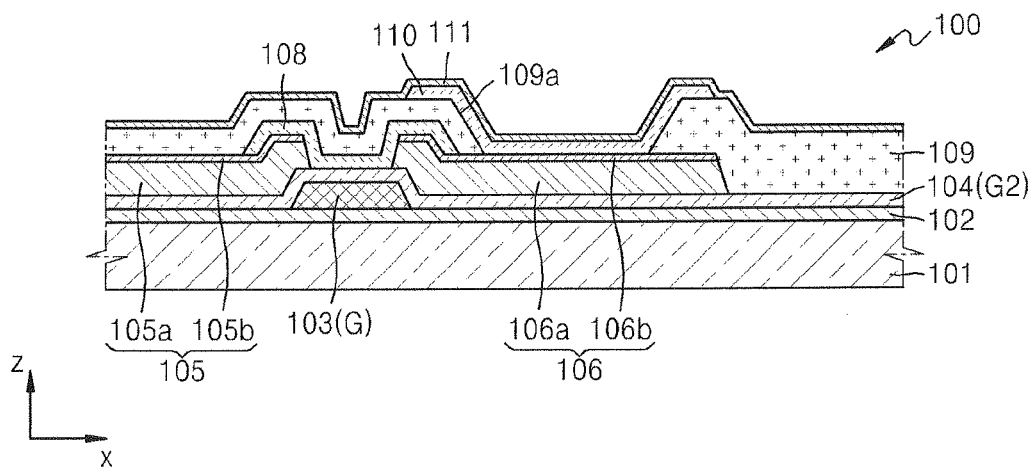

Then, in reference to FIG. 3F, an intermediate layer 110 and a second electrode 111 are formed on the pixel defining layer 109. The intermediate layer 110 may include an organic emission layer (not shown). The intermediate layer 110 is formed to correspond to the aperture 109a of the pixel defining layer 109. Thus, the intermediate layer 110 contacts the second conductive layer 106b of the drain electrode 106 via the aperture 109a.

When a pattern of the intermediate layer 110 is formed, a wet process, e.g., the photolithographic process, may not be used but the deposition process, the printing process, or the transfer process may be used. Thus, the intermediate layer 110 and the active layer 108 may be effectively prevented from being damaged.

Although not shown, a sealing member may be formed on the second electrode 111.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An organic light emitting display apparatus, comprising:
   a substrate;
   a gate electrode formed on the substrate;
   a source electrode and a drain electrode formed on the gate electrode and being insulated from the gate electrode;
   an active layer formed on the source electrode and the drain electrode and comprising an organic semiconductor material, at least one region of the active layer overlapping with the gate electrode;
   a pixel defining layer formed on the active layer and comprising an aperture;
   an intermediate layer disposed to correspond to the aperture of the pixel defining layer and comprising an organic emission layer; and
   an opposite electrode formed on the intermediate layer,
   with one of the source electrode and the drain electrode being formed to be long to act as a pixel electrode and one of the source and drain electrodes comprising a first conductive layer and a second conductive layer disposed on the first conductive layer, the second conductive layer formed to contact the intermediate layer.

2. The organic light emitting display apparatus of claim 1, wherein the pixel defining layer comprises a material, the HOMO energy level of which is lower than a work function of the second conductive layer.

3. The organic light emitting display apparatus of claim 1, wherein the pixel defining layer comprises an electron injection material or an electron transport material.

4. The organic light emitting display apparatus of claim 1, wherein the pixel defining layer comprises LiF, NaCl, CsF, $Li_2O$, BaO, LiQ, or $AlQ_3$.

5. The organic light emitting display apparatus of claim 1, wherein each of the source electrode and the drain electrode comprises the first conductive layer and the second conductive layer on the first conductive layer.

6. The organic light emitting display apparatus of claim 1, wherein the first conductive layer comprises molybdenum (Mo), aluminum (Al), titanium (Ti), or tungsten (W).

7. The organic light emitting display apparatus of claim 1, wherein the second conductive layer comprises an indium tin oxide (ITO), an indium zinc oxide (IZO), a zinc oxide (ZnO), an indium oxide ($In_2O_3$), an indium gallium oxide (IGO), or an aluminum doped zinc oxide (AZO).

8. The organic light emitting display apparatus of claim 1, wherein the organic semiconductor material comprises [1]Benzothieno[3,2-b]benzothiophene (BTBT), dinaphtho[2,3-b:2',3'-f]thieno[3,2-b]thiophene (DNTT), pentacene, or TIPS(Triisopropylsilylethynyl)-pentacene.

9. The organic light emitting display apparatus of claim 1, further comprising a gate insulating layer formed between the gate electrode and the source electrode and between the gate electrode and the drain electrode, and
wherein the active layer is disposed to contact the gate insulating layer.

10. The organic light emitting display apparatus of claim 9, wherein the second conductive layer is spaced apart from the gate insulating layer.

11. The organic light emitting display apparatus of claim 1, wherein the gate electrode comprises molybdenum (Mo), aluminum (Al), titanium (Ti), or tungsten (W).

12. The organic light emitting display apparatus of claim 1, wherein the active layer is disposed in a space between the source electrode and the drain electrode and contacts upper surfaces of the source electrode and the drain electrode, and
a width from among widths of the active layer, which corresponds to a direction perpendicular to a direction along which the source electrode faces the drain electrode, is equal to or greater than widths of the source electrode and the drain electrode.

13. The organic light emitting display apparatus of claim 1, wherein an electrode acting as a pixel electrode from among the source electrode and the drain electrode, acts as an anode.

14. A method of manufacturing an organic light emitting display apparatus, the method comprising steps of:
forming a gate electrode on a substrate;
forming a source electrode and a drain electrode on the gate electrode to be insulated from the gate electrode, with one of the source electrode and the drain electrode being formed to be long to act as a pixel electrode, one of the source electrode and the drain electrode comprising a first conductive layer and a second conductive layer disposed on the first conductive layer;
forming an active layer on the source electrode and the drain electrode to have at least one region that overlaps with the gate electrode, the active layer comprising an organic semiconductor material;
forming a pixel defining layer on the active layer to have an aperture;
forming an intermediate layer to correspond to the aperture of the pixel defining layer, the intermediate layer comprising an organic emission layer, with the second conductive layer of one of the source electrode and the drain electrode being formed to contact the intermediate layer; and
forming an opposite electrode on the intermediate layer.

15. The method of claim 14, wherein the active layer is formed according to a deposition process, a printing process, or a transfer process.

16. The method of claim 14, wherein the pixel defining layer is formed according to a deposition process, a printing process, or a transfer process.

17. The method of claim 14, wherein the intermediate layer is formed according to a deposition process, a printing process, or a transfer process.

18. The method of claim 14, wherein the opposite electrode is formed according to a deposition process, a printing process, or a transfer process.

19. An organic light emitting display apparatus, comprising:
a substrate;
a gate electrode formed on the substrate;
a source electrode and a drain electrode formed on the gate electrode to be insulated from the gate electrode;
an active layer formed on the source electrode and the drain electrode and comprising an organic semiconductor material, at least one region of the active layer disposed opposite to and facing the gate electrode;
a pixel defining layer formed on the active layer and comprising an aperture;
an intermediate layer disposed to correspond to the aperture of the pixel defining layer and comprising an organic emission layer; and
an opposite electrode formed on the intermediate layer,
with one of the source and drain electrodes extending to be disposed opposite to and face the opposite electrode, one of the source and drain electrode comprising a first conductive layer and a second conductive layer disposed on the first conductive layer, the second conductive layer of one of the source and drain electrode in contact with the intermediate layer, the intermediate layer being disposed between the opposite electrode and one of the source and drain electrodes.

* * * * *